(12) United States Patent
Oyamada et al.

(10) Patent No.: US 9,153,549 B2
(45) Date of Patent: Oct. 6, 2015

(54) SEMICONDUCTOR DEVICE

(71) Applicant: Noda Screen Co., Ltd., Aichi (JP)

(72) Inventors: Seisei Oyamada, Kashiwa (JP); Masamitsu Yoshizawa, Tokyo (JP); Hirotaka Ogawa, Owariasahi (JP)

(73) Assignee: NODA SCREEN CO., LTD., Aichi (JP)

( * ) Notice: Subject to any disclaimer, the term of this patent is extended or adjusted under 35 U.S.C. 154(b) by 0 days.

(21) Appl. No.: 14/005,941

(22) PCT Filed: Feb. 12, 2013

(86) PCT No.: PCT/JP2013/053218
§ 371 (c)(1),
(2) Date: Sep. 18, 2013

(87) PCT Pub. No.: WO2013/172060
PCT Pub. Date: Nov. 21, 2013

(65) Prior Publication Data
US 2014/0070368 A1 Mar. 13, 2014

(30) Foreign Application Priority Data
May 14, 2012 (JP) .................................. 2012-110753

(51) Int. Cl.
*H01L 23/00* (2006.01)
*H01L 23/498* (2006.01)
(Continued)

(52) U.S. Cl.
CPC .......... *H01L 24/07* (2013.01); *H01L 23/49822* (2013.01); *H01L 23/49827* (2013.01); *H01L 23/50* (2013.01); *H01L 23/60* (2013.01);
(Continued)

(58) Field of Classification Search
None
See application file for complete search history.

(56) References Cited

U.S. PATENT DOCUMENTS

| 7,193,329 | B2 | 3/2007 | Takahashi |
| 7,385,286 | B2 | 6/2008 | Iwaki et al. |

(Continued)

FOREIGN PATENT DOCUMENTS

| JP | 2003-60107 | 2/2003 |
| JP | 2003-204015 | 7/2003 |

(Continued)

OTHER PUBLICATIONS

Machine Translation of Japanese Patent JP2008-098273, Tenjikukatsura et al., PD: Apr. 24, 2008, Murata Mfg Co Ltd.*

(Continued)

*Primary Examiner* — Peniel M Gumedzoe
(74) *Attorney, Agent, or Firm* — Wenderoth, Lind & Ponack, L.L.P.

(57) ABSTRACT

A semiconductor device includes a semiconductor chip, an interposer, a surface circuit pattern, and a post array. The surface circuit pattern is formed on one surface of the interposer and includes chip side pads connected to an external connection pad of the semiconductor chip, junction pads, and interconnecting lines having an end connected to the chip side pads and another end connected to the junction pads. The interconnecting lines extend from the chip side pads toward an outer edge of the interposer. The post array includes conducting paths and insulating resin insulating the conductive paths from each other. The post array is arranged such that the conductive paths extend in a direction intersecting with the surface of the interposer. The conducting paths each have an end connected to the junction pad and another end to be connected to the printed wiring board.

3 Claims, 15 Drawing Sheets

(51) Int. Cl.
*H01L 23/50* (2006.01)
*H01L 23/60* (2006.01)
*H01L 23/64* (2006.01)
*H01L 25/065* (2006.01)
*H05K 1/14* (2006.01)
*H05K 3/36* (2006.01)

(52) U.S. Cl.
CPC ............ *H01L23/64* (2013.01); *H01L 25/0652* (2013.01); *H01L 25/0657* (2013.01); *H05K 1/141* (2013.01); *H01L 24/06* (2013.01); *H01L 2224/0401* (2013.01); *H01L 2224/05554* (2013.01); *H01L 2224/14133* (2013.01); *H01L 2224/14135* (2013.01); *H01L 2224/16227* (2013.01); *H01L 2224/81815* (2013.01); *H01L 2225/0652* (2013.01); *H01L 2225/06572* (2013.01); *H01L 2924/12032* (2013.01); *H01L 2924/15321* (2013.01); *H01L 2924/15788* (2013.01); *H01L 2924/171* (2013.01); *H01L 2924/351* (2013.01); *H05K 3/368* (2013.01); *H05K 2201/10378* (2013.01); *H05K 2201/10515* (2013.01); *H05K 2201/2036* (2013.01)

(56) References Cited

U.S. PATENT DOCUMENTS

| | | | |
|---|---|---|---|
| 7,565,739 | B2 | 7/2009 | Kitajima et al. |
| 2002/0180063 | A1 | 12/2002 | Iwaki et al. |
| 2003/0127737 | A1 | 7/2003 | Takahashi |
| 2003/0197287 | A1* | 10/2003 | Lin et al. .................. 257/778 |
| 2007/0170593 | A1 | 7/2007 | Kitajima et al. |
| 2007/0285907 | A1* | 12/2007 | Nishikawa et al. ........... 361/763 |
| 2008/0233676 | A1* | 9/2008 | Tsai ............................ 438/108 |
| 2011/0068444 | A1* | 3/2011 | Chi et al. ..................... 257/669 |

FOREIGN PATENT DOCUMENTS

| | | |
|---|---|---|
| JP | 2006-245289 | 9/2006 |
| JP | 2007-201188 | 8/2007 |
| JP | 2008-98273 | 4/2008 |

OTHER PUBLICATIONS

International Search Report mailed Mar. 12, 2013 in International (PCT) Application No. PCT/JP2013/053218.

* cited by examiner

SEMICONDUCTOR DEVICE

TECHNICAL FIELD

The present invention relates to a packaged semiconductor device that includes a semiconductor chip.

BACKGROUND ART

Semiconductor devices of this type are increasingly expected to have smaller size in recent years. For example, a package of a semiconductor chip and an interposer that are integrated with each other is mounted on a printed wiring board made of organic material such as a motherboard, namely, a CSP structure, is in practical use.

The semiconductor device in Patent Document 1 is an example of the CSP structure including a package in which a semiconductor chip is connected to an interposer made of organic material (resin). The interposer has a plurality of through holes, and solder balls are exposed at upper and lower surfaces of the interposer through the through holes. An external connection pad provided on the semiconductor chip is connected to an upper end of a solder post of the interposer. A lower end of the solder post is connected to a pad of the motherboard with a solder ball, for example. In this configuration, the packaged semiconductor device has a size only slightly larger than the size of the semiconductor chip. The size is regarded as almost the minimum.

RELATED ART DOCUMENT

Patent Document

Patent Document 1: Japanese Unexamined Patent Application Publication No. 2006-245289

DISCLOSURE OF THE PRESENT INVENTION

Problem to be Solved by the Invention

The above known structure is a three-dimensional structure in which the semiconductor chip is connected to the printed wiring board via the conductive post passed through the interposer in a vertical direction. This structure may cause the following problems.

(1) A wiring pitch of the printed wiring board is becoming more densely every year. However, the wiring pitch of the printed wiring board is not sufficient compared to a wiring pitch of a semiconductor process in which a silicon wafer is microfabricated to obtain a semiconductor chip. They are largely different. For example, a commonly used semiconductor chip includes external connection pads at a pitch of 35 to 75 μm, and a printed wiring board includes pads at a pitch of 400 to 800 μm.

In the known structure including the semiconductor chip and the printed wiring board that are connected by the interposer including the conductive post, the pads of the semiconductor chip and the pads of the printed wiring board are required to be arranged at the same pitch. Therefore, the pitch of external connection pads of the semiconductor chip is limited by the pitch of the pads of the printed wiring board. In other words, in the known semiconductor package, even if a commonly used semiconductor chip produced based on a finer design rule is attempted to be used, the pads of the printed wiring board cannot be arranged at a pitch corresponding to that of the external connection pads of the semiconductor chip. Thus, the latest fine semiconductor chip cannot be used. The pitch of the pads of the printed wiring board is a bottleneck. This results in an employment of a semiconductor chip having a large line width in accordance with a wiring pitch of the printed wiring board or a design of a unique semiconductor in which only external connection pads have a large width. As a result, the chip area becomes larger even if the gate number is the same, and thus the cost for the semiconductor chip becomes higher.

(2) The semiconductor chip generates a great deal of heat and increases its temperature when the semiconductor device is in running. In the known structure including the resin interposer, a silicon substrate of the semiconductor chip has a certain value of coefficient of linear thermal expansion that is largely different from that of a resin interposer. Thus, large thermal stress is generated at a solder joint between the semiconductor chip and the interposer. This lowers connection reliability. In addition, the resin interposer has high thermal resistance compared to the silicon board. The heat generated on the semiconductor chip is less likely to flow toward the interposer, and thus the semiconductor chip has a high temperature and the thermal stress at the joint is further increased.

(3) The interposer has a three-dimensional structure in which the solder post is arranged in the through hole. Accordingly, many processes including forming through holes, plating an inner surface of the through holes, applying solder paste in the through holes, and reflow soldering are required. This increases the production cost.

An object of the present invention is to provide a semiconductor device that can employ a common finer semiconductor chip without limitation by the wiring pitch of the printed wiring board and have a high reliability of the electrical joint, and further can be produced at a lower price.

Means for Solving the Problem

The semiconductor device disclosed herein is a semiconductor device to be mounted on a printed wiring board. The semiconductor device includes a semiconductor chip including a predetermined semiconductor integrated circuit and an external connection pad configured to connect the semiconductor integrated circuit to an external circuit, an interposer made of silicon or glass, a surface circuit pattern formed on one surface of the interposer, and a post array including a plurality of conducting paths and insulating resin insulating the conductive paths from each other. The surface circuit pattern includes chip side pads provided on a surface of the interposer and connected to the external connection pad of the semiconductor chip, junction pads, and interconnecting lines having an end connected to the chip side pads and another end connected to the junction pads. The post array is arranged such that the conductive paths extend in a direction intersecting with the surface of the interposer. The conducting paths each have an end connected to the junction pad and another end to be connected to the printed wiring board. The interconnecting lines extend from the chip side pads toward an outer edge of the interposer.

In the semiconductor device, the external connection pads of the semiconductor chip are connected to the printed wiring board via the surface circuit pattern formed on the surface of the interposer and via the post array. In the surface circuit pattern, the pitch between the interconnecting lines is wider at the outer edge side, i.e., at the junction pads side, because the interconnecting lines that are connected to the chip side pads to be connected to the external connection pads of the semiconductor chip are extended toward an outer edge of the interposer and connected to the junction pads. In other words, the formation pitch of the chip side pads at the inner side can be smaller than the formation pitch of the junction pads. Accordingly, a known semiconductor chip having a fine pitch can be used without limitation by the wiring pitch of the printed wiring board.

The surface circuit pattern of the interposer is a plane circuit that does not require through holes. The interposer is made of silicon or glass that is a flat insulator including SiO2 as a main component, and thus the fine surface circuit pattern can be formed on the interposer by a thin film formation process or a metal microfabrication process that is commonly used in the semiconductor production process. Thus, the production cost is low.

In addition, the semiconductor chip as a heat source is mounted on a back surface of the interposer with the circuit surface thereof facing upward. The back surface of the semiconductor chip is always positioned adjacent to the printed wiring board. With this configuration, heat generated on the semiconductor chip is dissipated through the interposer and the printed wiring board, and the rise in the temperature of the semiconductor chip is suppressed. Particularly, if a thermal conducting material such as silicone rubber that has low thermal resistance is arranged in a space between the semiconductor chip and the printed wiring board, the heat of the semiconductor chip is conducted to the printed wiring board having a large area, and the heat can be dissipated through a chassis of a device. The heat dissipation structure as above is most effective and cheap for a small and thin chassis of a mobile information device that cannot have a fan cooler, for example. This is a unique advantage of the package structure that employs a plane circuit structure that includes the interposer without through holes.

The interposer and the semiconductor chip have substantially the same coefficient of linear thermal expansion. Even if there is a large temperature difference between the semiconductor chip and the interposer, the thermal stress acting on the electrical joint between the semiconductor chip and the interposer is significantly small compared to the known structure including the interposer made of resin. This improves the reliability of joint.

On the other hand, a difference of the coefficient of linear thermal expansion between the interposer that is made of silicon or glass and the printed wiring board that is generally made of resin is relatively large. In the present invention, the interposer and the printed wiring board are connected via the post array. The post array includes conductive paths that are insulated from each other by the insulating resin and is arranged such that the conductive paths extend in a direction perpendicular to the surface of the interposer. With this configuration, the thermal stress can be absorbed when the conductive paths are bent together with the insulating resin. Accordingly, the reliability of joint at this part can be maintained at a high level.

Further, the semiconductor device of the present invention preferably includes a by-pass capacitor for a power supply system of the semiconductor chip or a clamp diode for I/O terminal on the surface of the interposer. Such passive devices are essential for the operation of the semiconductor chip. Since the known structure uses a resin board as the interposer, small discrete parts are mounted on the interposer or the printed wiring board. In the present invention, since the interposer is made of silicon or glass, the by-pass capacitor or the clamp diode can be formed on the surface by a commonly used microfabrication process. Accordingly, the semiconductor device according to the present invention can be treated as a high functional semiconductor component in which the passive devices required for the semiconductor chip is packaged.

If the passive devices are formed on the semiconductor chip together with the integrated circuit, an area to be required increases. This increases the size of the semiconductor chip, which increases price for each semiconductor chip. However, in the present invention, the price for each chip can be lowered, because an integrated circuit having high-density transistors is formed on the semiconductor chip. Further, in view of that the interposer is made ceramics, the above-described passive devices that require the large area are formed on the interposer that has an enough area. This allows extremely practical and efficient arrangement. If characteristic of the by-pass capacitor or the clamp diode needs to be changed, only the interposer needs to be changed. This allows flexible response to specification changes.

The power source terminals (VDDQ, VSSQ) for I/O terminals are provided at both sides of the I/O terminals separately from the power terminals (VDD, VSS) for internal logic circuit, because a relatively large current is flown to or out from the I/O terminal of the semiconductor chip such as a semiconductor memory. For high-speed operation of the semiconductor chip, in addition to that all of the power source terminals are connected to the power source line, the by-pass capacitor is preferably connected adjacent to the power source line of an output transistor in the semiconductor chip in order to supply the electric charges at high speed. In view of this, in the known structure, a discrete member as the by-pass capacitor is mounted on the surface or inside of the printed wiring board such that the by-pass capacitor and the above-described power source terminals are connected by the circuit pattern of the printed wiring board.

However, when the discrete member is mounted on the printed wiring board, the discrete member is arranged so as not to overlap with the semiconductor chip in a plane view. The discrete member and the power terminals of the semiconductor chip (the power source terminals VDDQ, VSSQ for I/O terminal that are especially required to be connected to the by-pass capacitor) are connected by a copper foil pattern having a certain length. Then, the cooper foil pattern inevitably has inductance between the by-pass capacitor and the power source terminal of the semiconductor chip. This adversely affects the high-speed responsiveness of the semiconductor chip.

In the present invention, the by-pass capacitor including a lower surface electrode, a dielectric, and an upper surface electrode is formed on the surface of the interposer, and the external connection pad for I/O power source of the semiconductor chip are connected to the surface electrode. Accordingly, the by-pass capacitor is positioned in an area overlapping with the semiconductor chip, and the power source terminal and the by-pass capacitor are connected with a shortest distance therebetween. This configuration minimizes the inductance of the interconnection and makes the most of the capacitance of the by-pass capacitor, and thus improves the responsiveness of the semiconductor chip.

The post arrays are produced as separate members from the semiconductor chip or the interposer and is connected to the interposer. Thus, throughput of the interposer is not affected at all, and the high productivity of the semiconductor device is maintained. Further, since the post arrays are produced separately from the semiconductor chip, specification thereof may be standardized to be a general-purpose member that is applicable to various semiconductor chips. Accordingly, special designs for each type of the semiconductor chips are unnecessary, and thus the development cost and the cost for reliability test can be largely reduced. In addition, the packaging cost of the semiconductor chip can be significantly reduced, because the post array has a simplified structure that is to be connected to the external connection pad of the semiconductor chip by reflow soldering.

A plurality of post arrays may be used for single interposer. The post arrays are spaced apart from each other and connected to the semiconductor chip. With this configuration, the post arrays can deform more freely, and thus this configuration is preferable in view of thermal stress relaxation.

The post array may be produced by cutting a base member including a plurality of metal wires and insulating resin in a direction intersecting with the metal wires. The metal wires are arranged such that axes thereof are parallel to each other and separated from each other by the insulating resin.

A longer conductive path may result in a longer production time if the conductive path is formed by plating. However, the production time may not be longer even if the post arrays are made to be thick (have longer metal wires), because the post arrays are produced by cutting the base member for the post arrays that includes the metal wires and the insulating resin surrounding the metal wires such that the metal wires are cut in a direction substantially perpendicular to its axis. In addition, such post arrays have high productivity, because the post arrays that are hardened with the resin can be easily handled.

Further, the thickness of the post array (corresponding to the thickness of the insulating resin and the length of the metal wire) can be set by adjusting cutting interval. Thus, the reliability of the joint can be further improved by setting the thickness of the insulating resin at a thickness suitable for thermal stress relaxation that is likely to occur based on the difference in the coefficient of liner thermal expansion between the interposer and the printed wiring board.

In the above-describe post array, to reduce the thermal stress, the insulating resin preferably has a coefficient of linear thermal expansion that is an intermediate value between the coefficient of linear thermal expansion of the interposer and that of the printed wiring board.

Advantageous Effect of the Invention

In the semiconductor device of the present invention, the circuit pattern can be extended on the interposer. Accordingly, the electrodes of the semiconductor chip that are arranged with a small pitch are connected without the limitation by the wide wiring pitch of the printed wiring board. Further, reliability of the electrical joint is high, because heat is likely to be dissipated directly from the back surface of the semiconductor chip toward the printed wiring board and the thermal stress is reduced. In addition, the semiconductor device can be produced at a lower cost.

MODE FOR CARRYING OUT THE INVENTION

A first embodiment of the present invention is described with reference to FIG. 1 to FIG. 9.

1. Configuration of a Semiconductor Device

Figure 1:
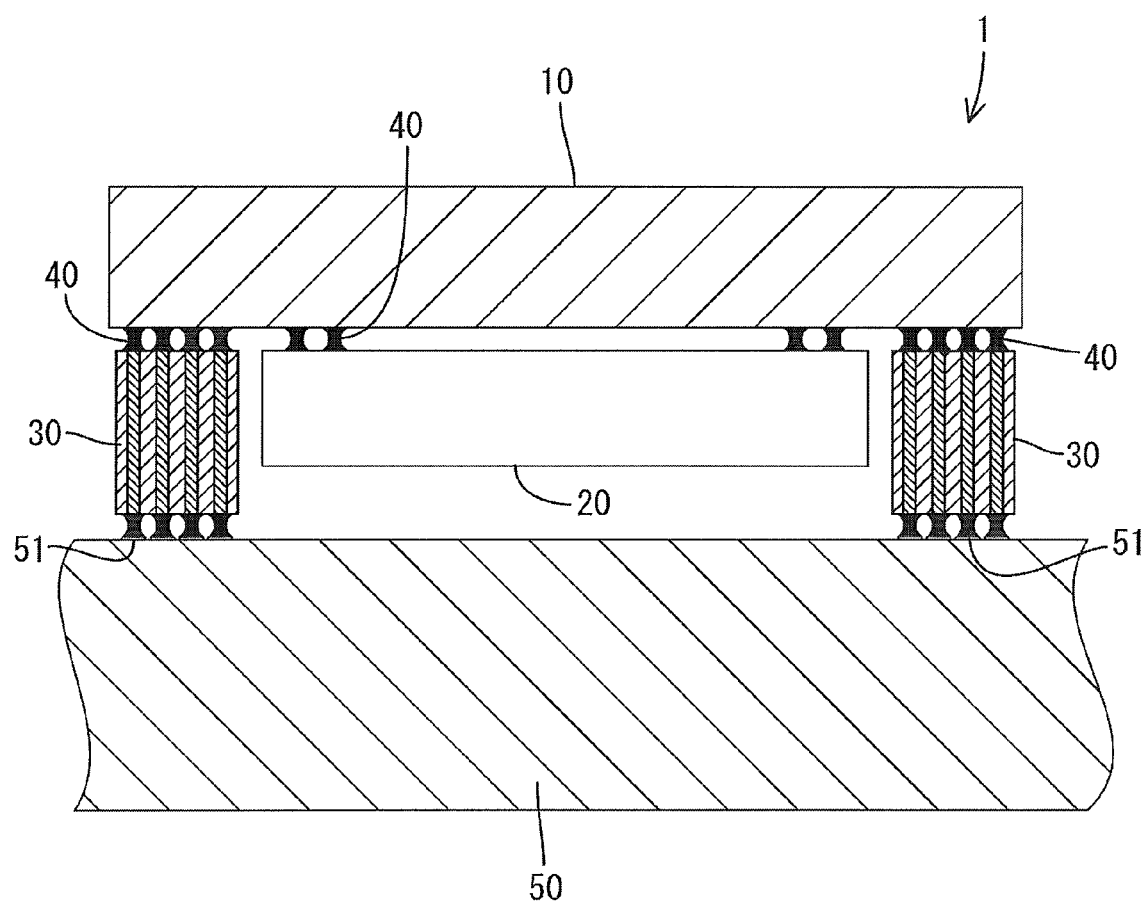
FIG. 1 is a cross-sectional view illustrating a semiconductor device of the present embodiment that is mounted on a circuit board.

FIG. 1 is a schematic cross-sectional view illustrating a semiconductor device 1 of the first embodiment. The semiconductor device 1 includes an interposer 10, a semiconductor chip 20, and a plurality of post arrays 30. The semiconductor device is packaged by connecting the semiconductor chip 20 and the post arrays 30 to one (a lower) surface of the interposer 10 with a reflow solder 40. The packaged semiconductor device 1 is mounted on a known printed wiring board 50 via the post arrays 30. The printed wiring board 50 includes an organic material (resin), e.g., the printed wiring board is made of glass epoxy.

Figure 2:
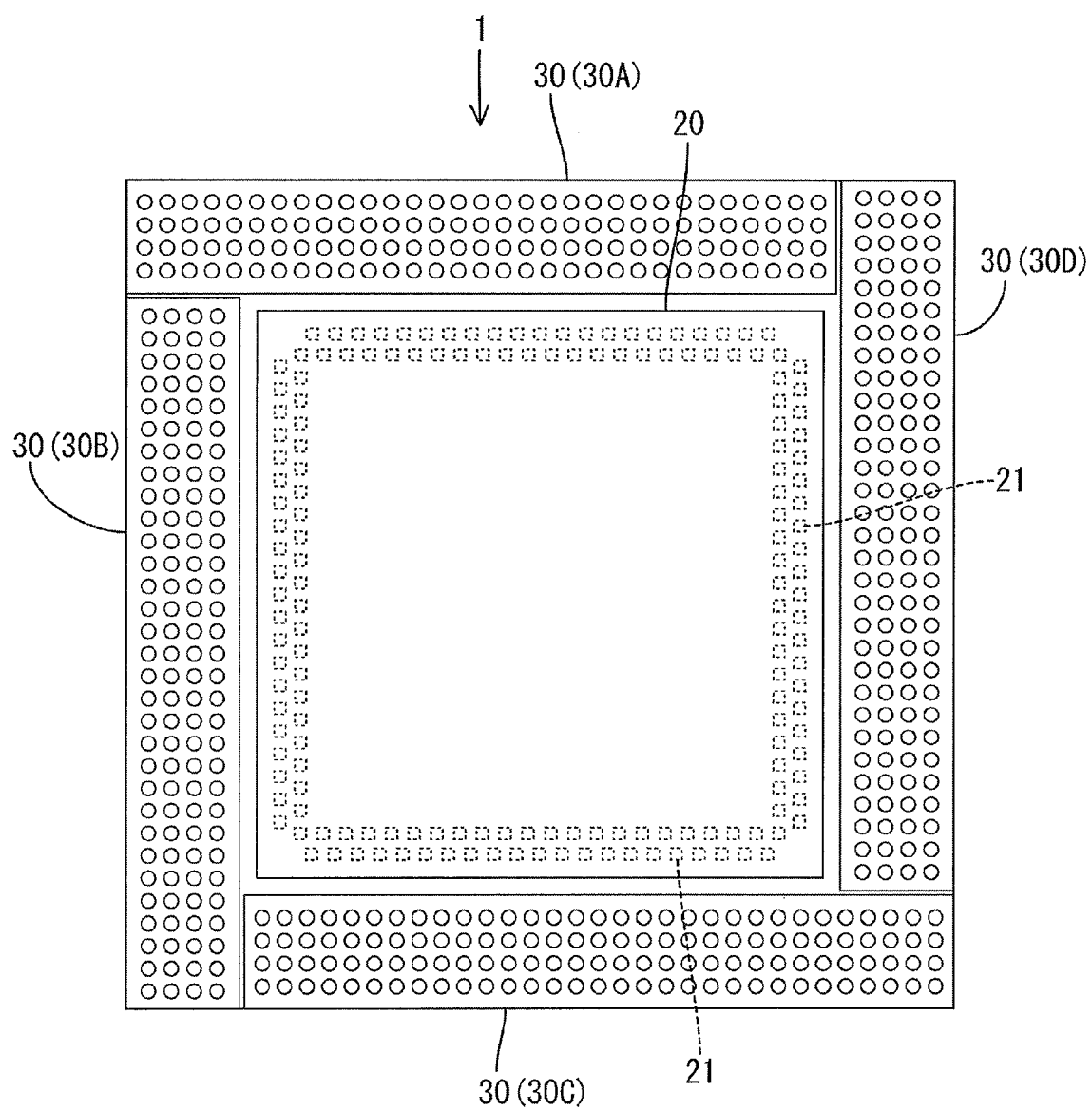
FIG. 2 is a bottom view of the semiconductor device of the present embodiment.

The semiconductor chip 20 has a kwon configuration including a silicon substrate and a predetermined semiconductor integrated circuit (not illustrated). The semiconductor integrated circuit is provided on a surface of the silicon substrate (an upper surface in FIG. 1) and includes a plurality of semiconductor elements. The semiconductor chip 20 has a rectangular shape of 5 mm on a side, for example. On an upper surface of the semiconductor chip 20, power source terminals and external connection pads 21 for input and output terminals (FIG. 3) are provided. The power source terminals are configured to connect the semiconductor integrated circuit to an external circuit thorough an opening in a passivation film. As illustrated in FIG. 2, the external connection pads 21 are arranged in a square frame-shaped area extending along an outer edge of the semiconductor chip 20. A total of 512 pads are arranged in two lines in a staggered manner at a pitch of 70 μm, for example.

Figure 3:
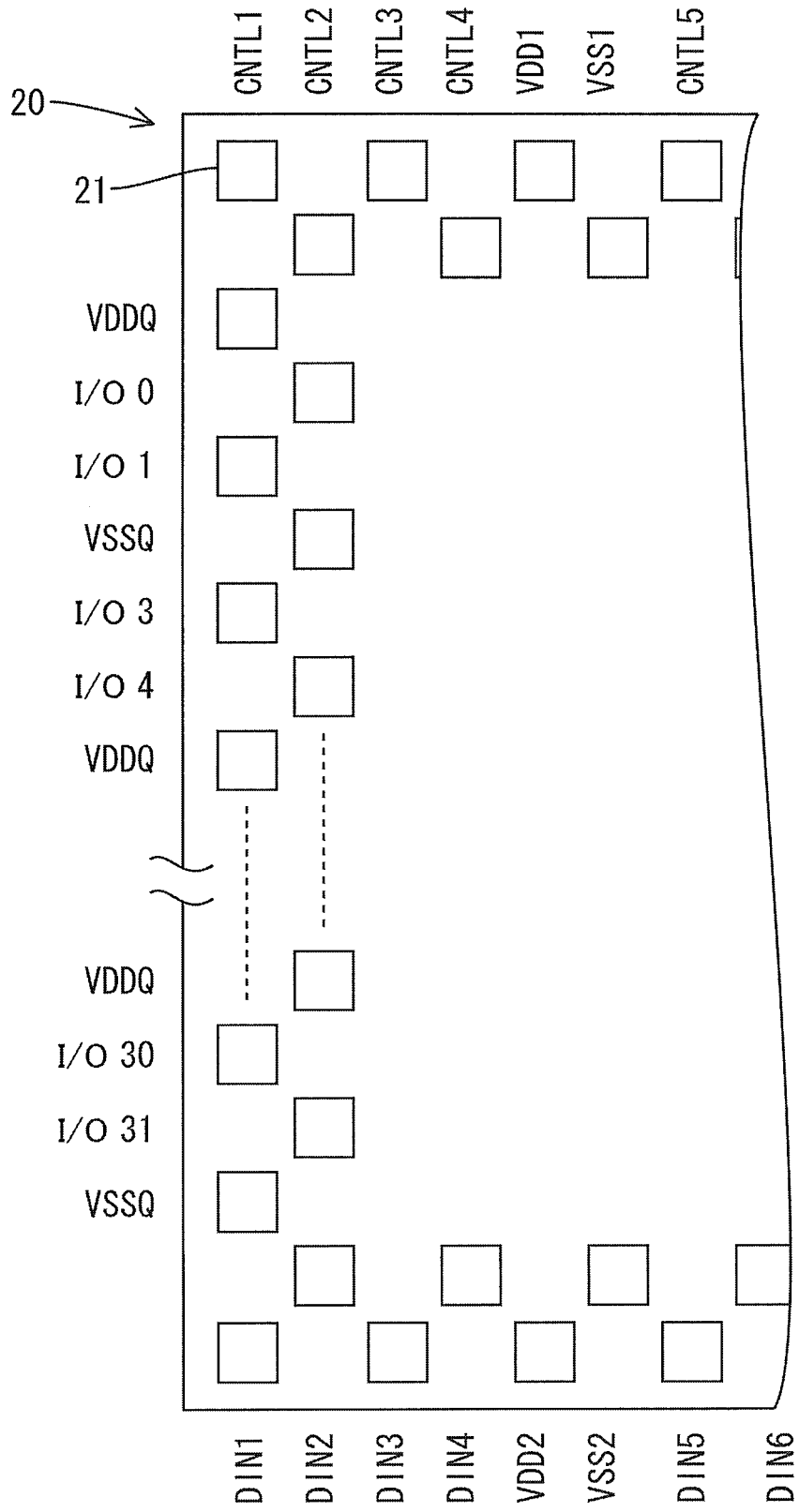
FIG. 3 is a plan view illustrating an arrangement of pads of the semiconductor chip.

A specific arrangement of the external connection pads 21 is illustrated in FIG. 3. Herein, an LSI having I/O terminals of 64 bits is illustrated. On opposing two sides of the square frame-shaped area (positioned on right and left sides in FIG. 3, the side on the right side is not illustrated), power source terminals VDDQ and VSSQ for I/O terminal are alternately arranged such that two I/O terminals are positioned therebetween. On the other two sides (upper and lower sides in FIG. 3), terminals for control signal CTRL# (# is any natural number), terminals for data input DIN#, power source terminals for internal logic circuit VDD#, VSS#, and a terminal for clock signal CLK are provided for example.

Figure 4:
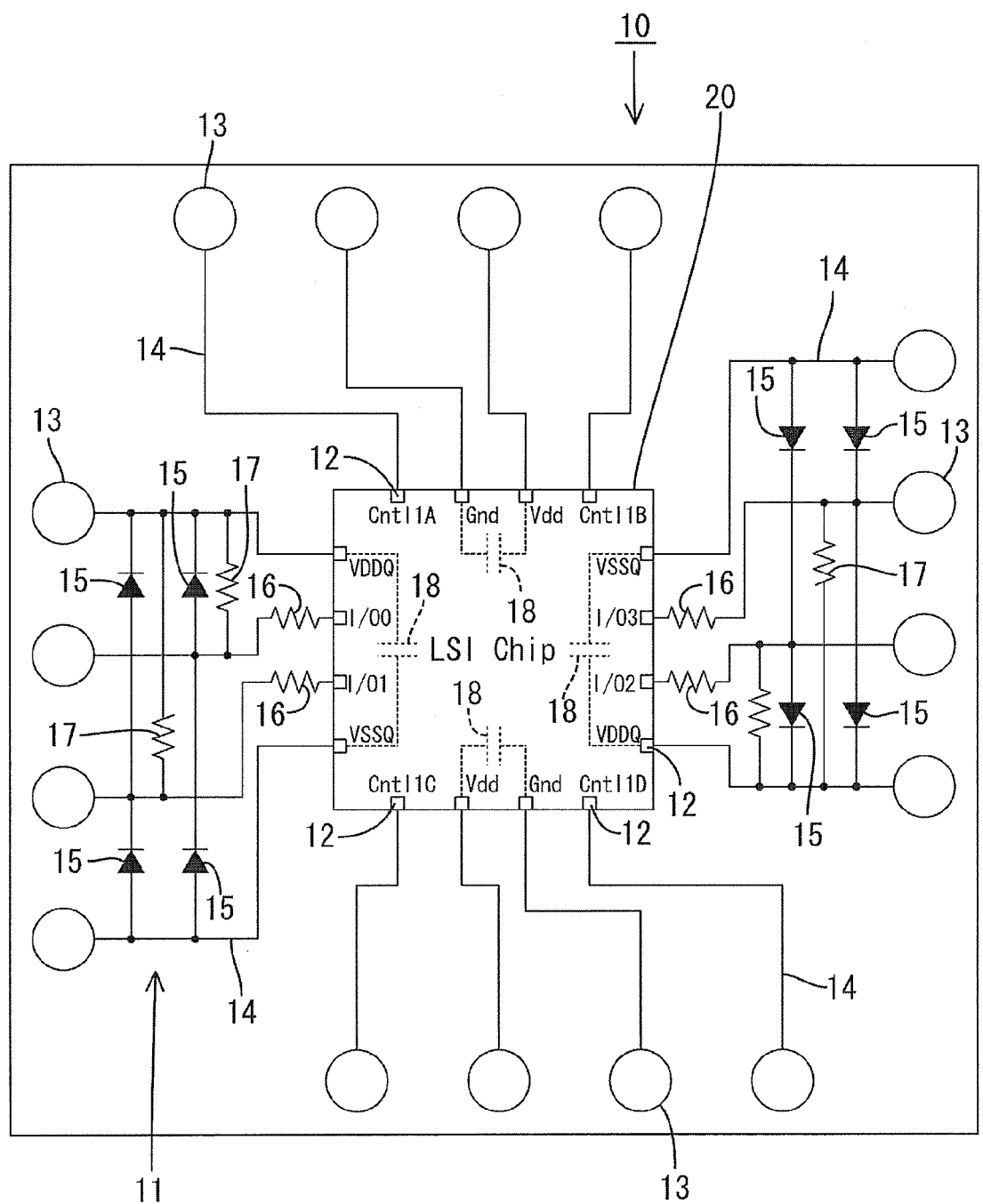
FIG. 4 is a simplified equivalent circuit diagram illustrating a circuit pattern and passive devices of the interposer.

The interposer 10 is produced by cutting a silicon wafer or a glass substrate into pieces. The interposer 10 has a rectangular shape of 7 mm on a side, for example. On one surface of the interposer 10, a surface circuit pattern and various passive devices are formed by a known wiring technique. The surface circuit pattern will be described in detail below. In FIG. 4, the surface circuit pattern 11 of the interposer 10 and the various passive devices that are formed together with the surface circuit pattern 11 are illustrated in an equivalent circuit diagram. Since the actual number of pads is very large, in FIG. 4, the number of pads is reduced to four on each side. Actually, as illustrated in FIG. 2, 128 pads are provided on one side.

As illustrated in FIG. 4, in a middle area of the interposer 10 that is a rectangular frame-shaped area corresponding to the external connection pads 21 of the semiconductor chip 20, chip side pads 12 are provided in the same number and size, and at the same pitch as the external connection pads 21. In a rectangular frame-shaped area extending along an outer edge of the interposer 10, junction pads 13 are provided in the same number as the external connection pads 21. The junction pads 13 and the chip side pads 12 are the same in number, and the chip side pads 12 are positioned at an inner side of the interposer 10 and the junction pads 13 are positioned in a rectangular frame-shaped area at an outer side of the interposer 10. The area at the outer side is larger than the area at the inner side. Accordingly, the pitch between the junction pads 13 is larger (for example, the pads having a diameter of 125 μm are arranged at a pitch of 250 μm) than the pitch between the chip side pads 12. Between the chip side pad 12 and the corresponding junction pad 13, a interconnecting line 14 is provided to extend from the chip side pad 12 toward the outer edge of the interposer 10.

On the interposer 10, in addition to the above-described surface circuit pattern 11, various passive devices are formed by a thin film formation process or a metal microfabrication process as schematically illustrated in FIG. 4 of an equivalent circuit. Damper resistors 16 for impedance matching are provided between the chip side pads 12 that are connected to the I/O terminals I/O 0 to I/O 3 of the semiconductor chip 20 and the corresponding junction pads 13. Clamp diode 15 are provided between the interconnecting lines 14 that are connected to the I/O terminals I/O 0 to I/O 3 and the interconnecting lines 14 that are connected to the power source terminals VDDQ and VSSQ for I/O terminals. Further, pull-up resistors 17 (or pull-down resistor) are provided between the interconnecting lines 14 that are connected to the I/O terminals I/O 0 to I/O 3 and the interconnecting lines 14 that are connected to the power source terminals VDDQ for I/O terminals.

The damper resistor 16 preferably has a relatively low resistance (10 to 50Ω) that is obtained by wiring resistance of polysilicon or metal resistance. The clamp diode 15 is an ESD protective circuit for an overvoltage clamp and is required to have a relatively high withstand voltage and fast response. Preferably, a PN junction extending along a relatively long metal wire (100 to 500 μm) may be used or a schottky-barrier diode may be constituted by two kinds of metals and SiO2 layer to have a fast clamp. The pull-up resistor 17 (or pull-up resistor) generally has a high resistance value of about 4.7 KΩ or more. This kind of resistor can have high resistance with a small resource by using a method in which a P-substrate is used as the interposer 10 to have N-well and P+ is diffused to obtain a diffused resistor and metal plating in which metal having high specific electrical resistance (Ni, Cr, for example).

Between each of pairs of the chip side pads 12 connected to the power source terminals for I/O terminal VDDQ, VSSQ, a by-pass capacitor is provided in an area overlapping with a mounting area of the semiconductor chip 20, i.e., directly above the semiconductor chip 20. In FIG. 4 that is a schematic view, only four by-pass capacitors 18 are illustrated. However, the by-pass capacitor 18 is actually provided for each pair of power source terminals for I/O terminal (32 by-pass capacitors for 32 pairs of power source terminals for 64 bit I/O, or if a plurality of by-pass capacitors is provided for each pair of the power source terminals, 32n by-pass capacitors, in which n indicates the number of by-pass capacitors for each pair of power source terminals).

Each by-pass capacitor 18 has a configuration illustrated in FIG. 5 and is produced as described below. On a surface (lower surface) of the interposer 10, first surface electrodes 18A are formed by metal sputtering or plating. Each of them is connected to one of the pair of power source terminals. As illustrated in FIG. 6A, an extended line section 18B of the first surface electrode 18A and a signal wiring 18C for I/O terminal are preferably formed of the same metal and at the same time as the first surface electrode 18A to simplify the steps.

Figure 6A:
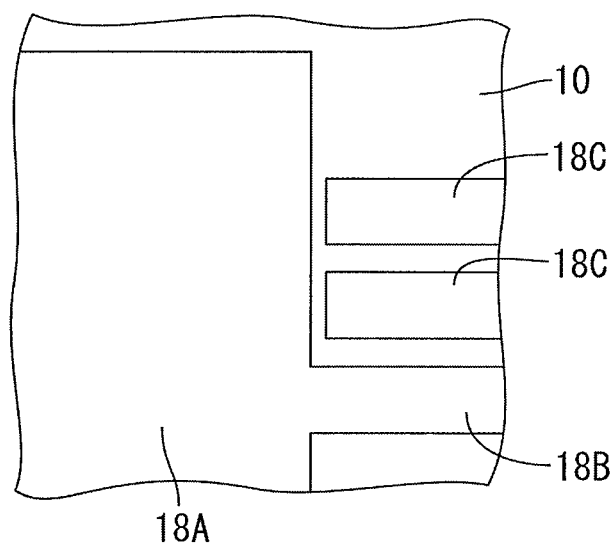
FIG. 6A is a plan view illustrating a production step of the by-pass capacitor.
Figure 6B:
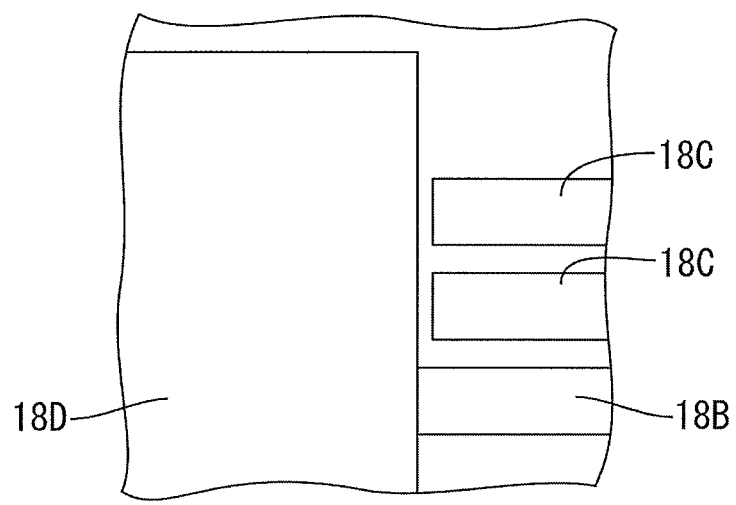
FIG. 6B is a plan view illustrating a production step of the by-pass capacitor.
Figure 6C:
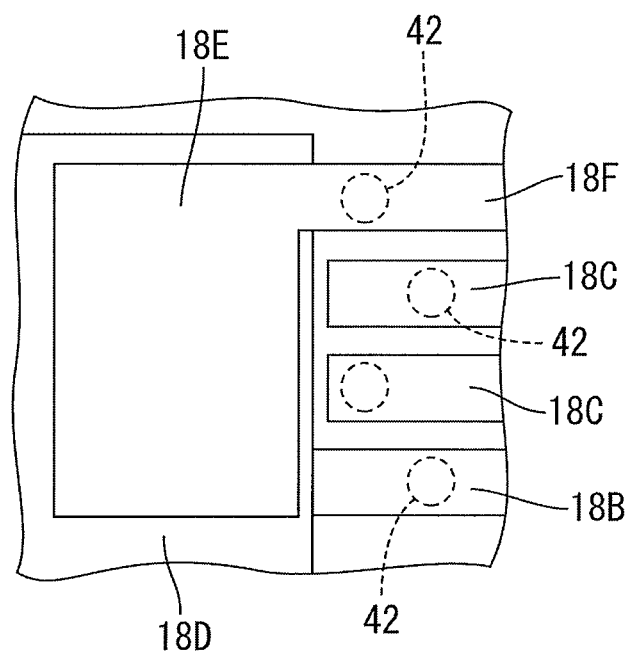
FIG. 6C is a plan view illustrating a production step of the by-pass capacitor.

Then, as illustrated FIG. 6B, a dielectric layer 18D made of a metal oxide film such as ITO or STO is formed over all of the first surface electrodes 18A such that the dielectric layer 18D is used as one dielectric layer common for all the by-pass capacitors 18. The dielectric layer may be separately formed over each of the first surface electrodes 18A.

The dielectric layer 18D is preferably formed by an aerosol deposition method disclosed in Unexamined Patent Application Publication No. 2008-141121 which is an application filed by the same applicant as the present application. Specifically, solution in which a metal oxide, which is a material of the dielectric layer, is dissolved is aerosolized by ultrasonic vibration and heated together with carrier gas while being supplied onto a silicon board or a glass board. The silicon board or the glass board is heated to a few hundred degrees, for example, to form a thin film of the metal oxide.

Then, second surface electrodes 18E are formed over the dielectric layer 18D by sputtering or plating like the first surface electrodes 18A. The second surface electrodes 18E each have the rectangular shape that is the same in shape and size as the first surface electrodes 18A. An extended line section 18F is integrally formed in the same manner as the first surface electrode 18A except that the extended line section 18F is positioned on an opposite side with respect to the signal wiring 18C (see FIG. 6C). Accordingly, as illustrated in FIG. 5, the by-pass capacitors 18 each including the first surface electrode 18A, the dielectric layer 18D, and the second dielectric electrode 18E in this sequence on the interposer 10 is formed for each pair of the power source terminals for I/O terminal VDDQ, VSSQ.

After the formation of the by-pass capacitors 18 as above, the semiconductor chip 20 is arranged to overlap with the above-described semiconductor chips 20. The extended line sections 18D, 18F of the first and second surface electrodes 18A, 18E included in the by-pass capacitor 18 are used as lands for connecting the semiconductor chip 20 to the interposer 10. Among the external connection pads 21 of the semiconductor chip 20, I/O terminals I/O#, I/O#+1, and a pair of the power source terminals VDDQ, VSSQ for the I/O terminals are connected to the signal wire 18C, the extended line section 18B of the first surface electrode 18A, and the extended line section 18F of the second surface electrode 18E by reflow soldering.

Figure 7:
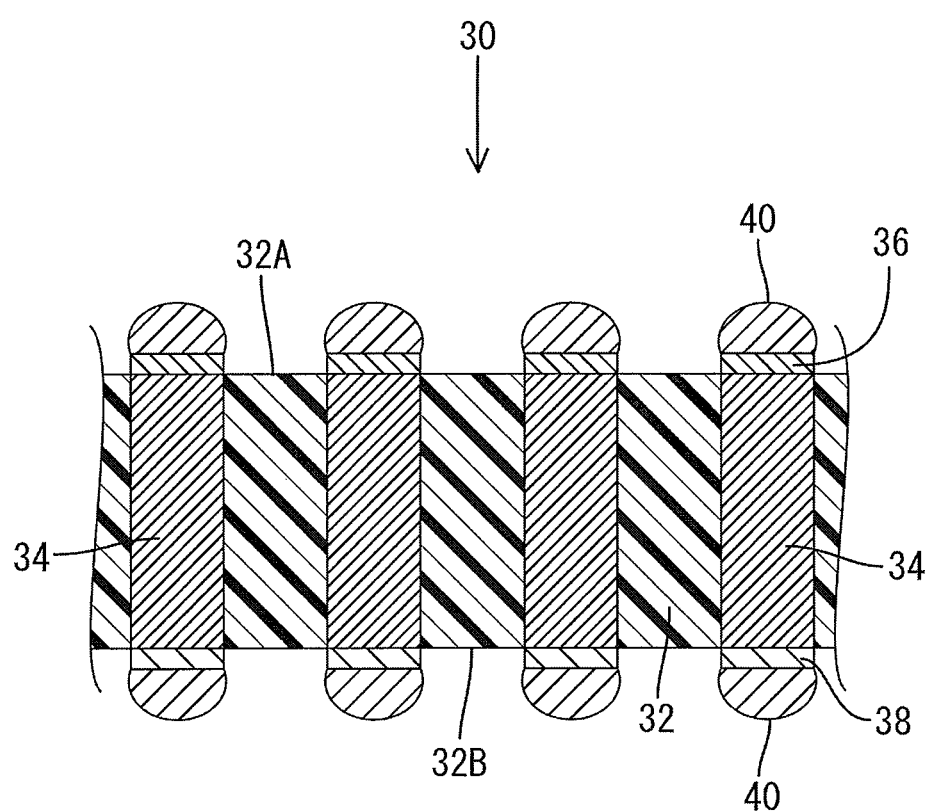
FIG. 7 is a magnified cross-sectional view of a post array.

As illustrated in FIG. 7, the post array 30 includes the metal wires 34 as the conductive path in the insulating resin 32. The insulating resin 32 surrounds the metal wires 34 so that the metal wires 34 are insulated from each other and a constant interval (arrangement pitch) therebetween is maintained. End surfaces of the metal wires 34 are flush with end surfaces of the insulating resin 32. A production method of the post arrays 30 will be described later. The insulating resin 32 is a synthetic resin that has a coefficient of linear thermal expansion smaller than that of the printed wiring board 50 (about 15 ppm) and larger than that of the silicon substrate (about 4 ppm) included in the semiconductor chip 20. The insulating resin 32 has flexibility that allows the metal wires 34 to be flexurally deformed.

On an upper surface 32A of the post array 30 to be connected to the interposer 10, first pads 36 are formed by flash plating with gold so as to overlap with an end surface of the metal wires 34. Similarly, on a lower surface 32B of the post array 30 to be connected to the pads 51 of the printed wiring board 50, second pads 38 are formed by flash plating with gold so as to overlap with an end surface of the metal wires 34. The first pads 36 and the second pad 38 are provided on front and back surfaces of the insulating resin 32 at a predetermined pitch so as to correspond to the metal wires 34. On a front surface of each first pad 36 and each second pad 38, a solder ball is attached and melted to form a solder bump 40.

As described above, the junction pads 13 are arranged on the lower surface of the interposer 10 in a matrix at a predetermined pitch in the rectangular area extending along the outer edge of the interposer 10. The post array 30 having the above configuration includes four post arrays 30A to 30D. The post arrays 30A to 30D are separately attached to each side of the rectangular shape, for example. The post arrays 30A to 30D are collectively produced as a base member for the post arrays that will be cut into pieces of the post arrays 30A to 30D. A production method thereof will be described later.

Figure 8:
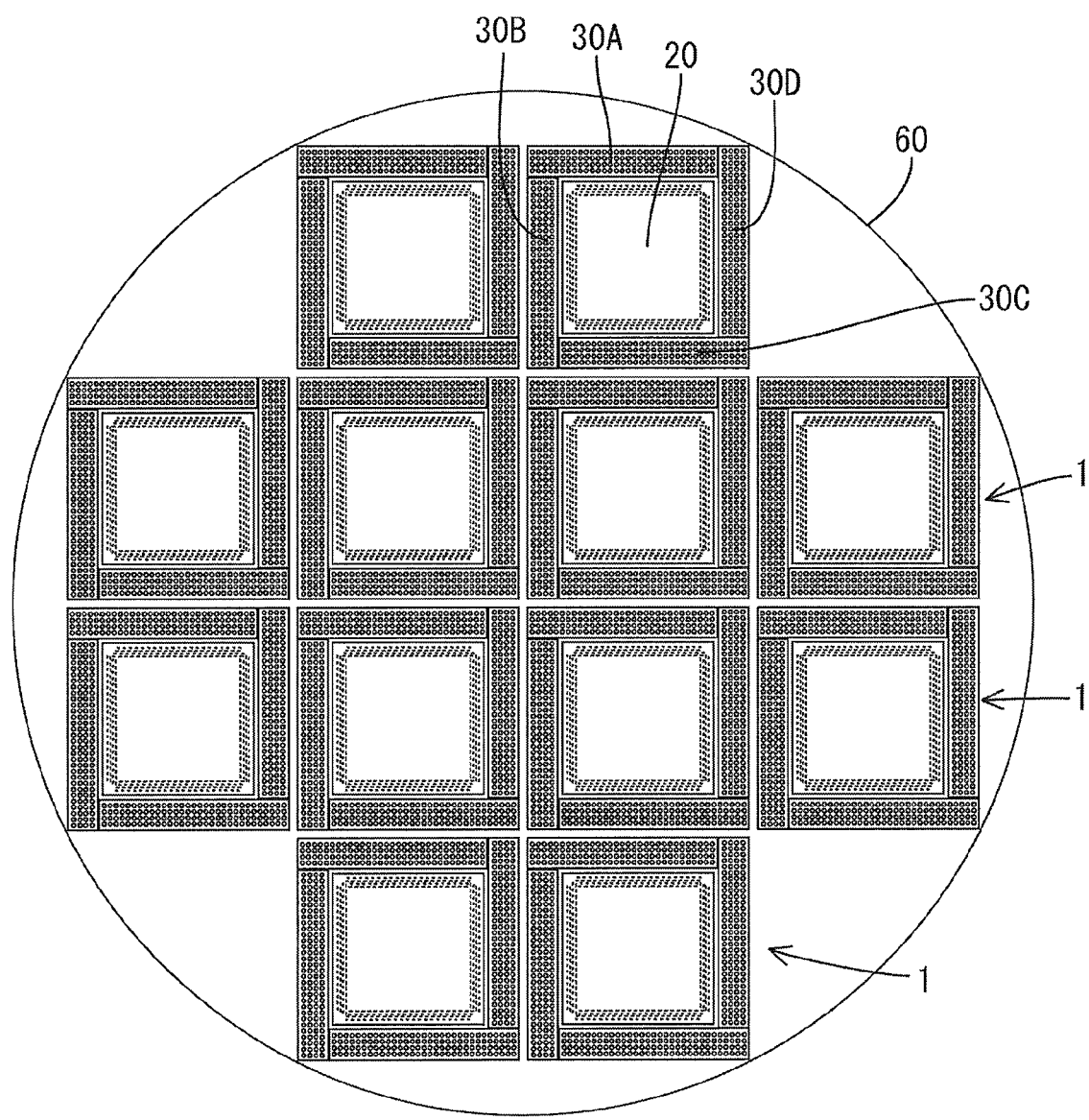
FIG. 8 is a plan view illustrating a production step of the semiconductor device of the present embodiment, in which the semiconductor devices are taken out from a silicon wafer.

The post arrays 30A to 30D and the semiconductor chip 20 are mounted onto the interposer 10 at wafer level. Specifically, as illustrated in FIG. 8, the post arrays 30A to 30D and the semiconductor chip 20 are arranged at predetermined positions of a silicon wafer 60 after the wiring pattern and the passive devices that correspond to each interposer 10 are provided by the thin film formation process or a metal microfabrication on the silicon wafer 60 for forming the interposer 10 and before the silicon wafer 60 is cut into pieces by dicing. Then, the post arrays 30A to 30D are connected by reflow soldering. Then, the back surface of the silicon wafer 60 is taped and the silicon wafer 60 is cut along dicing lines to divide the silicon wafer 60 into the interposers 10. Thus, the interposers 10 each integrally including the post arrays 30A to 30D and the semiconductor chip 20, i.e., the semiconductor devices 1 are produced at one time. In FIG. 8, only 12 semiconductor chips 20 are illustrated for simplification, because the actual number of semiconductor chips 20 is significantly large.

2. Production Method of Post Array 30

Figure 9:
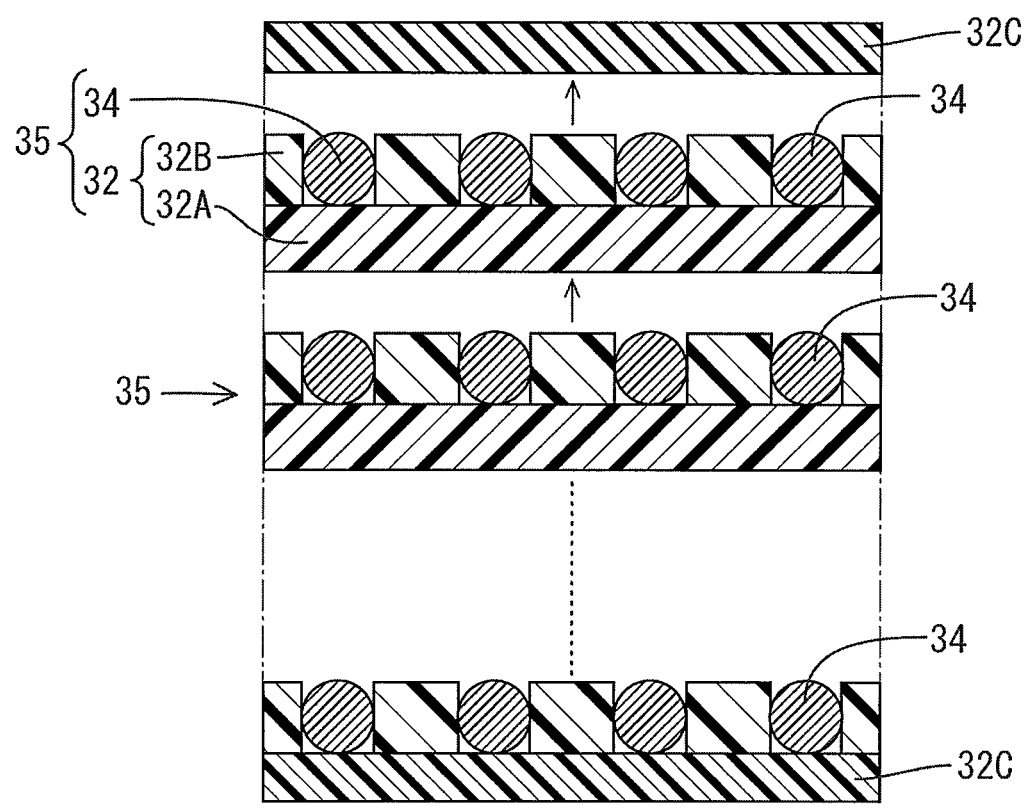
FIG. 9 is a cross-sectional view illustrating a production step of the post array.

Next, an example of the production method of the post array 30 is explained with reference to FIG. 9.

In this example, the post array 30 is produced with the insulating resin 32 and the metal wires 34. The insulating resin 32 includes layer spacers 32A and row spacers 32B. The layer spacers 32A separate the metal wires 34 arranged in an upper and lower direction in FIG. 9 from each other. The row spacers 32B separate the metal wires 34 arranged in a right to left direction in FIG. 9 from each other. The insulating resin 32 may be any type of known insulating resin that solidifies by heat or ultraviolet rays.

The layer spacer 32A made of such type of resin has adhesion at its surface. The layer spacer 32A is a flat sheet having a thickness of about 400 μm, for example. The row spacer 32B has a quadrangular prism shape having a thickness of about 400 μm and a width of about 400 μm, for example. Instead of the row spacers 32B, one resin sheet having parallel slits may be used. The metal wire 34 has a circular cylindrical shape having a diameter of 400 μm, for example. The metal wire 34 is made of a low-resistance metal such as copper, copper alloy, or aluminum.

In the production of the post array 30, the metal wires 34 and the row spacers 32B are alternately arranged in parallel with each other on the surface of the layer spacer 32A to form a unit structure sheet 35. An axial direction of the metal wire 34 corresponds to a direction perpendicular to a plane of FIG. 8. As a result, the unit structure sheet 35 has a layer that includes the metal wires 34 and the row spacers 32B on one surface of the layer spacer 32A. The layer has a thickness of 125 μm.

Then, unit structural sheets 35 are attached to each other in the thickness direction of the layer spacers 32A to form a layer structure. The layer structure is pressed a little in the thickness direction and the width direction to remove gap. Heat or ultraviolet rays are applied to the layer structure to cure the layer spacers 41 and the row spacers 42 (which does not mean complete loss of flexibility). Accordingly, the metal wires 34 are held parallel to each other with a space therebetween by the layer spacers 32A and the row spacers 32B. The metal wires 34 appear to be embedded in the insulating resin. The metal wires 34 each having a diameter of 125 μm are arranged at a pitch of 250 μm.

The cured layer structure is sliced along a plane intersecting with the metal wires 34 at an interval of 200 μm or 500 μm, for example, such that the layer structure is sliced into a plurality of sheets. Accordingly, the insulating resin and the metal wires 34 are cut to provide the base member for the post arrays (not illustrated) that includes the insulating resin 32 having a thickness corresponding to a cutting interval and the metal wires 34 having a length corresponding to the cutting interval and arranged in the resin layer. Then, gold flash plating is performed for each surface of the base member to form the pad on each end of the metal wire 34. Further, a resist film having openings at positions corresponding to the pads is formed by printing or photolithography. Solder balls are arranged on the openings and heat treatment is performed to obtain the sheet-like base member for the post arrays on which solder bumps are attached.

Then, the base member for the post arrays is cut into pieces each including a predetermined number of metal wires 34 to form the post arrays 30A to 30D. Each of the post arrays 30A to 30D is a piece including a total of 128 metal wires 34 arranged in four rows and thirty-two columns as illustrated in FIG. 2, for example. The pieces (four pieces in FIG. 2) of the post arrays are each connected to the semiconductor chip 20. The post arrays 30A to 30D are arranged such that adjacent post arrays extend in a direction substantially perpendicular to each other with a gap therebetween. The post arrays 30A to 30D are each mounted to be in contact with each electrode terminal 14 of the semiconductor chip 20, for example, and connected thereto by reflow soldering. The post arrays 30A to 30D float above the semiconductor chip 20 by surface tension of the solder melted during the reflow and move naturally to an optimal connection position. That is, this allows a self-alignment.

3. Effects of the Present Embodiment

The semiconductor device 1 of the present embodiment includes the interposer 10 on which the semiconductor chip 20 and the post array 30 are integrated. Thus, the semiconductor device 1 can be used as one independent packaged member. With this configuration, the semiconductor chip 20 is connected to the printed wiring board 50 via the surface circuit pattern 11 formed on the surface of the interposer 10 and the post arrays 30.

The surface circuit pattern 11 extends radially outwardly from the circuit chip 20 positioned at a center of the interposer 10 to the junction pads 13. The pitch between the adjacent chip side pads 12 that are positioned at the middle of the interposer 10 is smaller than the pitch between the adjacent junction pads 13 that are positioned at a side closer to the outer edge of the interposer 10. Accordingly, even if the pitch between the junction pads 13 at the side closer to the outer edge is relatively large due to the limitation of the wiring pitch of the printed wiring board 50, the pitch between the chip side pads 12 at the inner side is sufficiently small. Thus, the semiconductor chip 20 having a common fine pitch can be used.

The surface circuit pattern 11 of the interposer 10 is a plane circuit that does not include through holes. The interposer 10 is made of silicon or glass. The fine surface circuit pattern 11 can be formed by a common semiconductor process with a high degree of accuracy, and thus the interposer 10 can be produced at a low cost.

The interposer 10 is formed of silicon, which is a material of the semiconductor chip 20, or a glass substrate. The semiconductor chip is mounted on a back surface of the interposer such that the circuit surface thereof faces an upper side and the back surface thereof faces a lower side. The entire back surface of the semiconductor chip is positioned adjacent to the printed wiring board and the semiconductor chip is in contact with the printed wiring board 50 via the silicone rubber, for example, at a large area of a silicon flat surface of the semiconductor chip. Accordingly, the semiconductor chip 20 has high heat dissipation properties, so that a temperature of the semiconductor chip 20 is less likely to increase.

Further, the interposer 10 and the semiconductor chip 20 have substantially the same coefficient of linear thermal expansion. Accordingly, even if the semiconductor chip 20 and the interposer 10 have a temperature difference, the thermal stress acting on the solder joint between the semiconductor chip 20 and the interposer 10 is significantly small compared to a known structure including an interposer made of resin. Thus, electrical joint reliability is high.

There is a relatively large difference in a coefficient of linear thermal expansion between the interposer 10 made of silicon or glass and the printed wiring board 50 generally made of resin. In the present embodiment, the interposer 10 and the printed wiring board 50 are connected by the post arrays 30. The post arrays 30 are arranged such that the metal wires 34 thereof extend in a direction perpendicular to the surface of the interposer 10. The metal wires 34 are insulated from each other by the insulating resin 32. With this configuration, the metal wires 34 are bent in a planar direction of the interposer 10 together with the insulating resin 32 to absorb the thermal stress. Thus, the reliability of the solder joint section can be further highly maintained.

Further, in the present embodiment, the interposer 10 is the silicon board or the glass board which allows passive device formation and micro wiring by a thin film formation process or a metal microfabrication process. Thus, the surface circuit pattern 11 is formed on the interposer 10 and the passive devices such as the clamp diode 15 and the resistor 17, which are required for stable operation of the semiconductor chip 20, are formed on the interposer 10. Accordingly, the semiconductor device 1 of the present embodiment can be handled as one packaged member including the semiconductor chip 20 and the passive devices that are essential for the operation of the semiconductor chip 20. Thus, the circuit configuration of the printed wiring board 50 can be simplified. If the passive devices 15 to 17 are formed on the semiconductor chip 20 together with the integrated circuit, an area to be required increases. This increases the size of the semiconductor chip, which increases price for each semiconductor chip. However, in the present invention, the area to be required is reduced and the price for each chip can be lowered, because only an integrated circuit having high-density transistors that are active devices is formed on the semiconductor chip. If characteristic of the passive devices needs to be changed, only the interposer 10 needs to be changed. This allows flexible response to specification changes.

When a semiconductor memory or an image process chip is used as the semiconductor chip, relatively large current is input to or output from the I/O terminal of the semiconductor chip. Therefore, in the present embodiment (see FIG. 3), power source terminals for I/O terminal (VDDQ, VSSQ) are provided at both side of the I/O terminal separately from the power source terminals for internal logic circuit (VDD, VSS). For high-speed operation of the semiconductor chip 20, in addition to that all of the power source terminals are connected to the power source line, the by-pass capacitor is preferably connected to the power source line in order to supply the electric charges at high speed. In the present embodiment, the by-pass capacitor 18 including the lower surface electrode 18A, the dielectric layer 18D, and the upper surface electrode 18E is formed in an area of the surface of the interposer 10 that overlaps with the semiconductor chip 20, in view of that the interposer 10 is made of a silicon board or a glass board that can be processed by a thin film formation process or a metal microfabrication process. The external connection pads 21 for I/O power source (VDDQ, VSSQ) of the semiconductor chip 20 are connected to the electrodes 18A and 18E. A distance between the power source terminals (VDDQ, VSSQ) and the by-pass capacitor 18 is a minimum. Accordingly, inductance of the wiring can be minimized to make the most of capacitance of the by-pass capacitor 18 and increase responsiveness of the semiconductor chip 20.

The post arrays 30 of the present embodiment is obtained by cutting the base member that includes the metal wires 34 that are arranged with the axis thereof extending in the same direction and are spaced apart from each other with the insulating resin 32 in a direction intersecting with the metal wires 34. The post array 30 does not affect a production throughput of the interposer 10, because the post array 30 is separately produced from the semiconductor chip 20 and the interposer 10 and attached to the interposer 10. The productivity of the semiconductor device 1 can be highly maintained. Since the post array 30 is produced separately from the semiconductor chip 20, the specification thereof may be standardized to be general-purpose member that can be applied to various semiconductor chips 20. Accordingly, special designs for each type of the semiconductor chips 20 are unnecessary, and thus development cost and cost for reliability test can be largely reduced. In addition, the packaging cost of the semiconductor chip 20 can be significantly reduced, because the post array 30 has a simplified structure that is to be connected to the external connection pad of the semiconductor chip 20 by the reflow soldering.

Further, a longer conductive path may result in a longer production time if the conductive path is formed by plating. However, the production time may not be longer even if the post array 30 is made to be thick (have longer metal wires 34), because the post array 30 is produced by cutting the base member for the post arrays including the metal wires 34 and the insulating resin 32 surrounding the metal wires 34 such that the metal wires 34 are cut in a direction substantially perpendicular to its axis. In addition, the post arrays 30 have high productivity, because the post arrays 30 that are hardened with the resin can be easily handled.

Furthermore, the thickness of the post array 30 (corresponding to the thickness of the insulating resin 32 and the length of the metal wire 34) can be set by adjusting cutting interval. Thus, the reliability of the solder joint can be further improved by setting the thickness of the insulating resin 32 at a thickness suitable for thermal stress relaxation that is likely to occur based on the difference in coefficient of liner thermal expansion between the interposer 10 and the printed wiring board 50. Further, in the present embodiment, the post arrays 30 (four post arrays) are connected to a single interposer 10. The post arrays 30 are spaced apart from each other. With this configuration, the post arrays 30 can change its shape more freely, which is favorable in view of the thermal stress relaxation.

Other Embodiments

The present invention is not limited to the above embodiment described in the above description and the drawings. The following aspects are also included in the technical scope of the present invention, for example.

(1) In the above-described embodiment, the post array 30 includes the insulating resin 32 and the metal wires 34 arranged in the insulating resin 32, but the present invention is not limited thereto. Any post array that includes conductive paths insulated from each other by an insulating resin may be used. The conductive path is not limited to the metal wire, but may be a metal foil. Further, the metal wire is not limited to a metal wire made of copper or copper alloy, and may be made of low resistance metal material such as aluminum or may be a multicore wire.

(2) When the post array is produced by use of the metal wires, the arrangement of the metal wires 34 are not limited to the arrangement in which the metal wires 34 are separated by the unit structure sheet 35 or the layer spacer 32A. For example, electric wires that include metal wires coated with thermal adhesive resin may be gathered and the thermal adhesive resin may be cured. Then, the gathered electric wires may be sliced such that the metal wires are cut in a direction intersecting with its axis.

Figure 10:
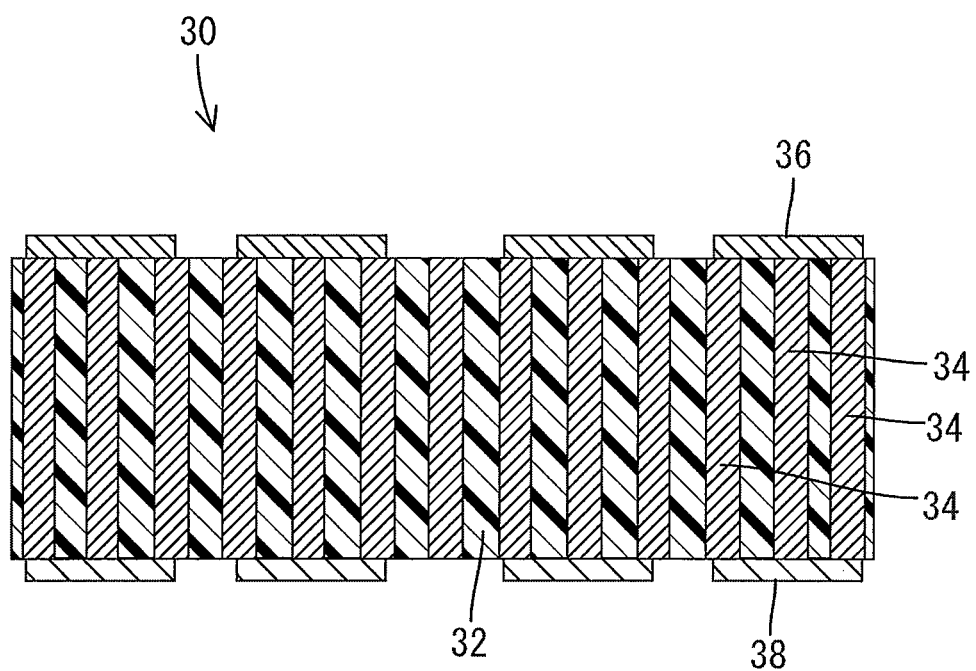
FIG. 10 is a magnified cross-sectional view illustrating a modification of the post array.

(3) In the above-described embodiment, each of the metal wires 34 of the post array 30 corresponds to one first pad 36 and one second pad 38, but the present invention is not limited thereto. As illustrated in FIG. 10, one first pad 36 and one second pad 38 may correspond to a plurality of metal wires 34 each having a diameter smaller than the diameter of the first and second pads 36, 38. With this configuration, in the production of the post array 30, even if the first pad 36 and the second pad 38 are positioned away from a predetermined position, at least one of the metal wires 34 can be in contact with the first and second pads 36, 38. This configuration does not require high accuracy of the formation of the pads 35, 36, which results in increase in productivity.

(4) In the above-described embodiment, the post arrays 30 connects the semiconductor chip 20 and the printed wiring board 50 made of glass epoxy. However, the circuit board may not be a circuit board made of organic material such as glass epoxy. The circuit board may be a silicon board, a glass board, or a circuit board made of other inorganic material such as a semiconductor.

(5) The board of the interposer 10 may be made of glass such as borosilicate glass, quartz glass, or soda glass as long as a thin film formation and a metal microfabrication can be performed.

Figure 11:
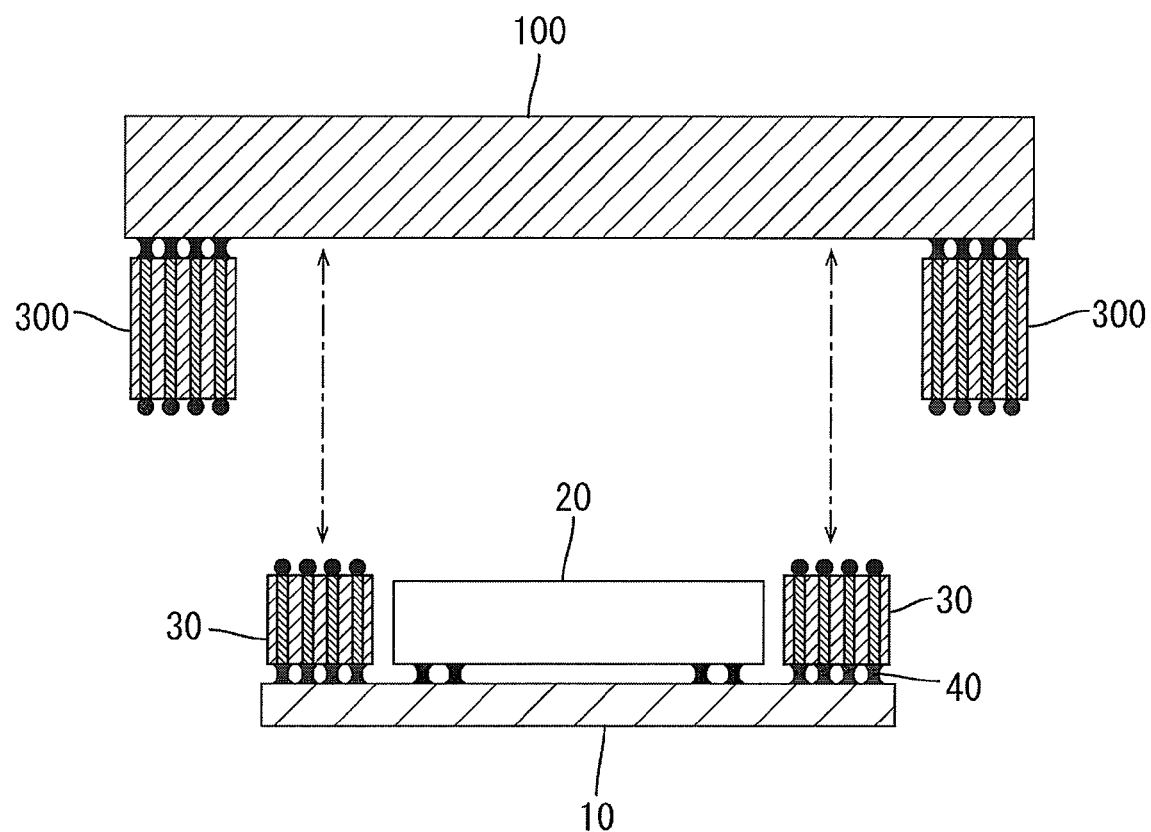
FIG. 11 is an exploded cross-sectional view illustrating another embodiment in which the interposer has a multistage configuration.
Figure 12:
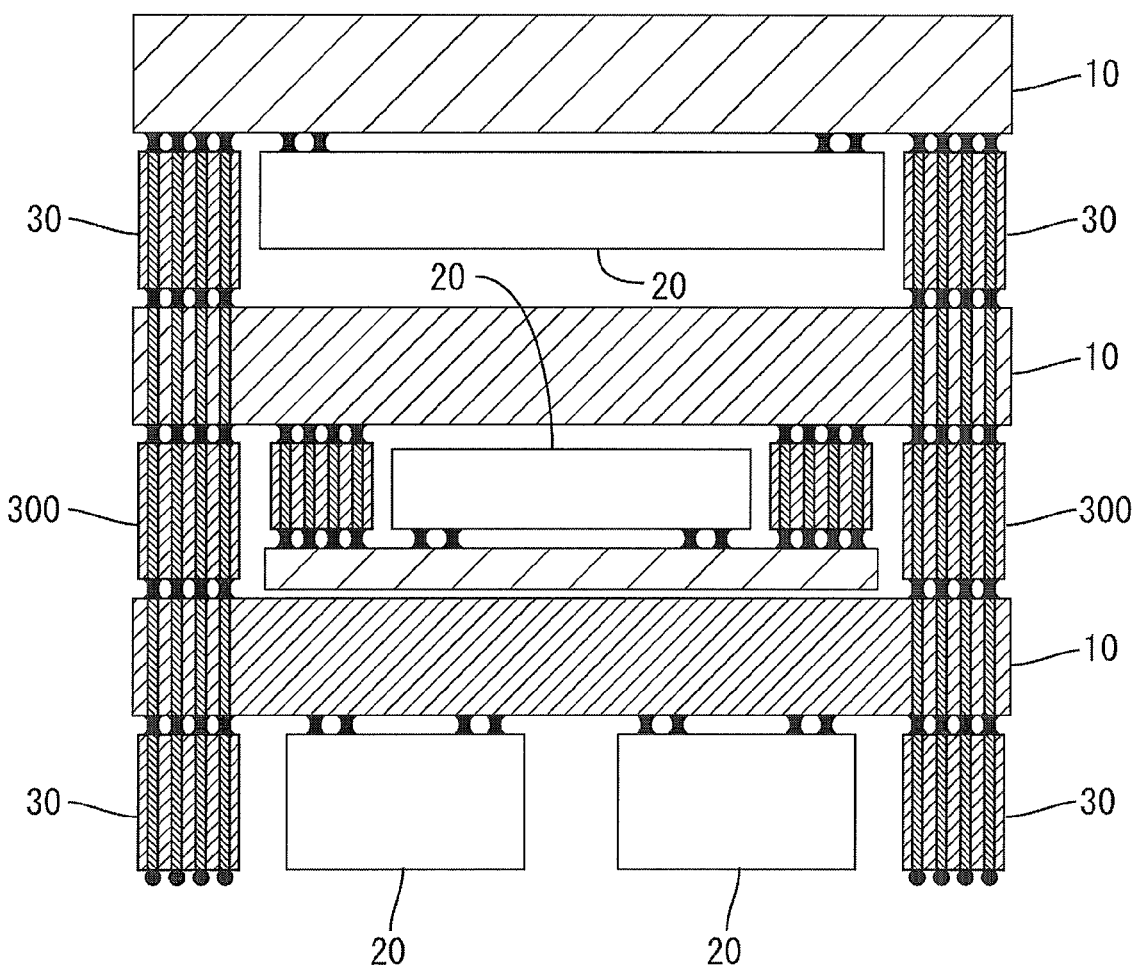
FIG. 12 is a cross-sectional view illustrating another embodiment in which the semiconductor device has a multistage configuration.

(6) In the above-described embodiment, a single semiconductor chip 20 is mounted on a single interposer 10. However, a plurality of semiconductor chips 20 may be mounted on a single interposer 10. Further, as illustrated in FIG. 11, the interposer may have a multistage configuration. In the multistage configuration, the semiconductor device 1 in which the semiconductor chip 20 and the post arrays 30 are mounted on the interposer 10 is connected to an auxiliary interposer 200 made of silicon or glass via the post arrays 30, and the semiconductor device 1 is connected to a printed wiring board via post arrays 300 that are attached to the auxiliary interposer 100. The printed wiring board is not illustrated. With this configuration, the semiconductor device 1 can be multifunctionalized by having a peripheral circuit on the interposer 100 by thin film formation or metal microfabrication. In addition, as illustrated in FIG. 12, the semiconductor device 1 can be configured as a semiconductor multi-chip package in order to be further multifunctionalized. The semiconductor multi-chip package is three-dimensionally constructed by having a multistage configuration that includes a plurality of interposers 10, 100 connected via the post arrays 30, 300. In such a case, the interposers except for the interposer on the top are preferably made of glass, because through holes are required to be formed therethrough for electric connection between upper and lower steps.

Figure 5:
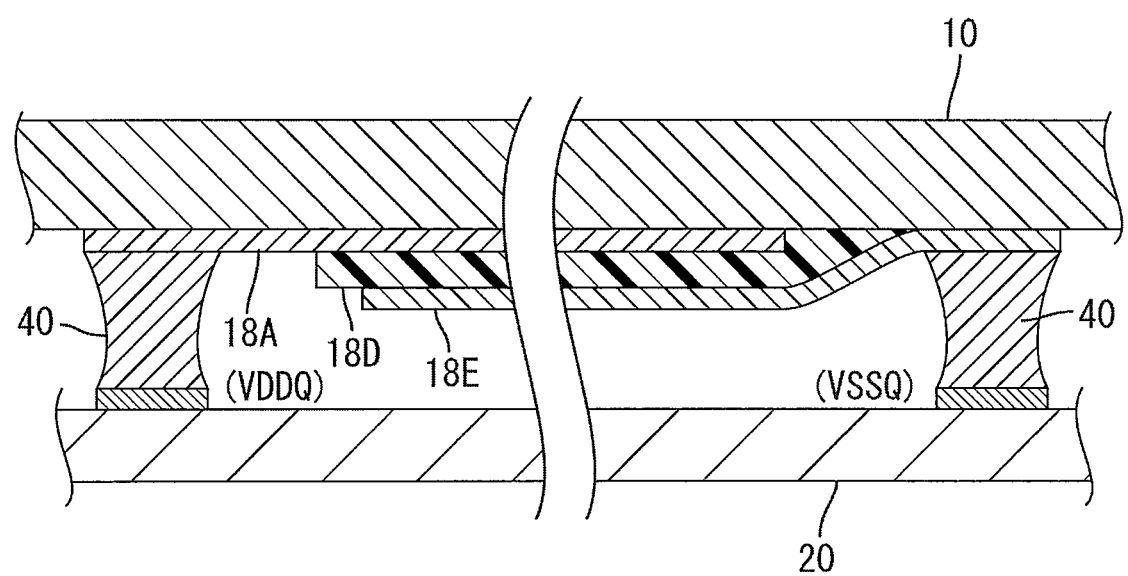
FIG. 5 is a magnified cross-sectional view illustrating a structure of a by-pass capacitor.
Figure 13:
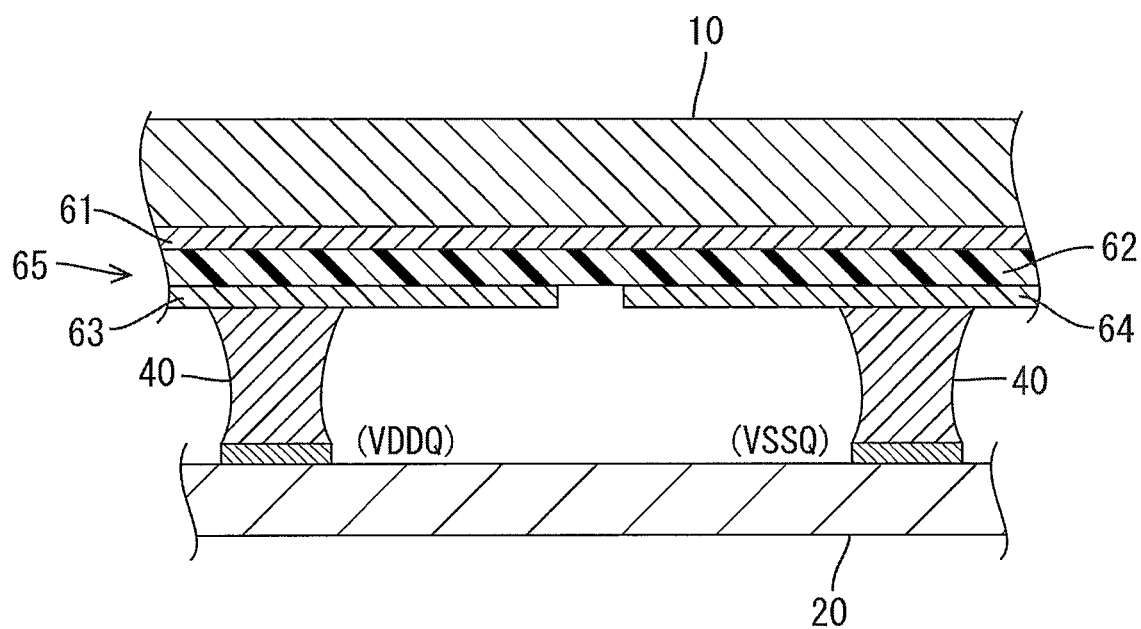
FIG. 13 is a magnified cross-sectional view illustrating a by-pass capacitor having a different structure.

(7) In the above-described embodiment, as illustrated in FIG. 5, the by-pass capacitor 18 is configured such that the first surface electrode 18A connected to one of the power source terminals VDDQ and VSSQ is formed on the surface of the interposer 10 and the second surface electrode 18 connected to the other one is arranged on the first surface electrode 18A with the dielectric layer 18D therebetween. However, the present invention is not limited thereto. A by-pass capacitor 65 having a configuration as illustrated in FIG. 13 may be used. In this configuration, initially, an intermediate electrode 61 is provided on a surface (preferably, entire surface) of the interposer 10. The intermediate electrode 61 may be a metal surface electrode formed by sputtering or plating. If the interposer 10 is made of silicon, P-type or N-type diffusion layer that has low-specific resistance (several tens of ohm or lower) may be used instead of the metal electrode. Then, a dielectric layer 62 is provided on a surface (preferably, entire surface) of the intermediate electrode 61 like the above-described embodiment. When the intermediate electrode 61 and the dielectric layer 62 are provided on the entire surface, a photolithography process for masking or etching is not required. Then, a first surface electrode 63 and a second surface electrode 64 may be formed by masking or etching and connected to the power source terminals VDDQ and VSSQ by the solder 40.

Explanation of Symbols

1: semiconductor device, 10, 100: interposer, 11: surface circuit pattern, 12: chip side pads, 13: junction pad, 14: interconnecting line, 15: clamp diode, 18: by-pass capacitor, 18A, 18E: surface electrode, 20: semiconductor chip, 30, 300: post array, 32: resin layer, 34: metal wire, 40: solder joint, 50: printed wiring board

The invention claimed is:
1. A semiconductor device to be mounted on a printed wiring board, the semiconductor device comprising:

a semiconductor chip including a predetermined semiconductor integrated circuit and an external connection pad configured to connect the semiconductor integrated circuit to an external circuit;

an interposer made of silicon or glass;

a surface circuit pattern formed on one surface of the interposer, the surface circuit pattern including:

chip side pads provided on the surface of the interposer and connected to the external connection pad of the semiconductor chip;

junction pads; and interconnecting lines connecting the chip side pads to the junction pads, the interconnecting lines extending from the chip side pads toward an outer edge of the interposer;

a post array including a plurality of conducting paths and insulating resin insulating the conductive paths from each other, the post array being arranged such that the conductive paths extend in a direction intersecting with the surface of the interposer, the conducting paths being connected to the junction pads and to be connected to the printed wiring board; and a by-pass capacitor for a power supply system of the semiconductor chip provided on the surface of the interposer on which the surface circuit pattern is formed and in an area of the surface of the interposer overlapping with a mounting area of the semiconductor chip, wherein the by-pass capacitor includes a first surface electrode, a second surface electrode, and a thin film dielectric layer, the thin film dielectric layer being formed over the first surface electrode, and the second surface electrode being formed over the thin film dielectric layer, wherein the external connection pad included in the semiconductor chip includes:

an external connection pad for I/O; and a pair of external connection pads for an I/O power source arranged such that the external connection pad for I/O is positioned therebetween, and wherein each of the first and second surface electrodes is respectively connected to one of the pair of external connection pads for the I/O power source by soldering.

2. The semiconductor device according to claim 1, wherein the post array includes a plurality of post arrays, and the post arrays are spaced apart from each other and connected to the semiconductor chip.

3. The semiconductor device according to claim 1, wherein the first and second surface electrodes are metal sputtered electrodes or metal plated electrodes.

* * * * *